United States Patent [19]

Cleland et al.

[11] 4,129,463
[45] Dec. 12, 1978

[54] POLYCRYSTALLINE SILICON SEMICONDUCTING MATERIAL BY NUCLEAR TRANSMUTATION DOPING

[75] Inventors: John W. Cleland, Knoxville; Russell D. Westbrook; Richard F. Wood, both of Oak Ridge; Rosa T. Young, Knoxville, all of Tenn.

[73] Assignee: The United States of America as represented by the United States Department of Energy, Washington, D.C.

[21] Appl. No.: 811,348

[22] Filed: Jun. 29, 1977

[51] Int. Cl.² .......................... B05D 3/06; H01L 27/14
[52] U.S. Cl. ......................................... 148/33; 148/15; 252/62.3 E; 252/950; 357/59; 357/91
[58] Field of Search .................. 252/62.3 E, 950, 951; 136/89 TF; 357/59, 91; 148/1.5

[56] References Cited

U.S. PATENT DOCUMENTS

| | | | |
|---|---|---|---|
| 3,467,557 | 9/1969 | Sterling | 148/175 |
| 3,961,997 | 6/1976 | Chu | 148/174 |
| 3,978,333 | 8/1976 | Crisman et al. | 250/211 J |
| 4,027,051 | 5/1977 | Reuschel et al. | 427/35 |
| 4,042,454 | 8/1977 | Haas et al. | 148/1.5 |
| 4,058,418 | 11/1977 | Lindmayer et al. | 148/175 |

OTHER PUBLICATIONS

Cuomo et al., "Polycrystalline Semiconductor Solar Cell" IBM-TDB, vol. 17 (1975) 2455.
DiStefano et al, "Reduction of G.B. Recombination in Poly-Si Solar Cells," Appl. Phys. Letts. 30 (1977) April, 351.
Chu et al., "Si Solar Cell on Metr. Si", IEEE. Trans. vol. ED-24, (1977) April, 442.
Chu, T. L., "Reducing G.B. Effects in Poly-Si Solar Cells" Appl. Phys. Letts. 29 (1976) 675.
Soclof et al., "G.B. and Impurity Effects in Low Cost Si Solar Cells," Conf. Record, 11th EEE Photospecialist Conf., May 1975.
Card et al.,"... G.B. in Poly Semiconductors", Digest IEEE Int'l Electron Device Meeting, Wash., D.C., Dec. 1976.
Tech. Inf. on SILSO" Poly Si for high efficiency Solar cells", Wacker Chemibronic, 6/1976.
Fisher et al, "Low Cost Solar Cells Based Si", IEEE Trans. vol. 24 ED, (1977) April, 438.

Primary Examiner—L. Dewayne Rutledge
Assistant Examiner—Upendra Roy
Attorney, Agent, or Firm—Dean E. Carlson; Stephen D. Hamel; Allen H. Uzzell

[57] ABSTRACT

A NTD semiconductor material comprising polycrystalline silicon having a mean grain size less than 1000 microns and containing phosphorus dispersed uniformly throughout the silicon rather than at the grain boundaries.

8 Claims, 9 Drawing Figures

IMPROVED POLYCRYSTALLINE SILICON SEMICONDUCTING MATERIAL BY NUCLEAR TRANSMUTATION DOPING

BACKGROUND OF THE INVENTION

This invention was made in the course of, or under, a contract with the United States Energy Research and Development Administration. It relates in general to photovoltaic conversion of solar energy to electricity and, more specifically, to a silicon semiconductor material suitable for use in such photovoltaic devices.

For several years an intensive effort has been underway to develop highly efficient photovoltaic cells for conversion of solar energy to electricity. The primary interest has been silicon doped with p- and n-type dopants to provide a p-n junction. Phosphorus is a well-known n-type dopant for silicon. Each atom in a pure silicon crystal has four valence electrons which are shared with adjacent silicon atoms in covalent bonding. When silicon crystals are doped with phosphorus which occupies the same lattice sites but has five valence electrons, the doped crystals contain electrons in excess of a pure crystal, one for each of the phosphorus atoms. At a given temperature many of these excess electrons are separated from the phosphorus atoms by thermal energy and are free to wander in the crystal rendering it an electron-conducting n-type semiconductor. Analogously, when silicon is doped with boron which has only three valence electrons, there will be one electron too few to complete the covalent bonding in the vicinity of each boron atom. This electron vacancy or "hole" appears to the lattice to be positively charged because an electron would normally occupy that site. The hole then is a positive charge carrier which, when thermally detached from the boron impurity, is free to wander in the crystal making it a hole-conducting p-type semiconductor. When a p-type and n-type semiconductor are joined together crystallographically, electrons in the n-type portion diffuse across the joining boundary into the electron deficient p-type region until a voltage equal to the sum of the diffusion potentials of the holes and electrons is established across the boundary, or p-n junction. In accordance with the energy band representation of semiconductors, by virtue of the electron and hole flows, the conduction and valence bands in the p-type material rise in energy relative to those in the n-type region. Because the Fermi level, which represents the electrochemical potential, was originally higher in the n-type crystal, the level is equalized within the joined crystals and across the p-n junction. This equalization is a result of the n-type material feeding electrons to the p-type material and the p-type material feeding holes to the n-type material. The p-type portion now contains a disproportionate amount of electrons and is at a more negative potential which causes a permanent electric field across the junction. If light of greater energy than the valence to conduction band gap falls upon the crystal, it may be absorbed by valence band electrons which are thus excited to the conduction band leaving a vacant electronic state — a hole in the valence band. Under the influence of the electric field, the photoexcited electrons will be driven toward a lower energy state, the n-type portion of the crystal, while the holes move toward a lower energy state which for them is in the p-type region. Accordingly, a photovoltage is created and a current can flow in an external circuit.

Not all solar energy is appropriately absorbed by photovoltaic cells. Due to selective absorbence and junction losses as well as conversion of much of the absorbed energy to heat, the maximum theoretically obtainable efficiency for a silicon photovoltaic cell is about 22%. While cell efficiencies as high as 16% have been obtained in silicon solar cells developed for extraterrestrial application, such cells were fabricated from expensive single crystal silicon. The difficulties associated with mass production of single crystal silicon have prevented silicon photovoltaic cells from being cost effective for large scale terrestrial purposes. Since size, weight and efficiency for ground-based solar energy installations are not so critical as for space applications, some sacrifice in efficiency can be tolerated, and the cost of the cell can be significantly reduced. Accordingly, a moderately priced, moderately efficient solar cell has long been needed.

PRIOR ART

A significant improvement in cost effectiveness would be achieved if a moderately efficient solar cell could be fabricated from polycrystalline silicon. Polycrystalline silicon (polysil) is defined for purposes of this invention as silicon having a mean grain (crystal) size of no more than 1000 microns. Mean grain size is defined as:

$$\frac{\Sigma N_i d_i}{N}$$

where $N_i$ is the number of grains having equivalent area diameter $d_i$, and N is the total number of grains. Such silicon is readily available commercially and is normally produced by chemical vapor deposition; depositing silicon from decomposing silane vapor onto a substrate such as silicon, aluminum, graphite, etc.

It has not been possible to obtain a uniform and controlled dopant concentration at the desired dopant concentration levels by chemical vapor deposition polysil film techniques. See, for example, A. L. Fripp, Journal of Applied Physics, Vol. 46, Page 1240 (1975) and M. E. Cowher and T. D. Sedgwick, Journal of the Electrochemical Society, Vol. 119, Page 1565 (1972). It is believed that the dopant migrates to the grain boundaries or that free carriers are trapped at the grain boundaries. Furthermore, in chemical vapor deposited polysil, the material remains essentially intrinsic until a certain fraction of the grain boundary bonds are neutralized by migration or by free carrier trapping. In addition, the presence of too many dopant atoms in the grain boundaries may lead to enhanced electrical conduction, thereby decreasing the shunt resistance across a polysil solar cell and reducing the photovoltaic conversion efficiency. Attempts at introducing phosphorus dopant into polysil films or slices by diffusion techniques have likewise resulted in grain boundary aggregation of phosphorus. Once again the presence of too many dopant atoms in the grain boundaries may lead to enhanced electrical conduction, thereby decreasing the shunt resistance and reducing the photovoltaic conversion efficiency. Ion implantation techniques, useful for doping thin layers, do not provide a uniform spacial distribution of dopant but introduce a distribution of dopant which varies with depth. There is no known method of crystal growth that provides a uniform ($\pm$ 1%) distribution of any chemical impurity dopant in silicon. Accordingly, a method for introducing a uniform and controlled dopant concentration in polysil films or ingots has long been needed.

SUMMARY OF THE INVENTION

It is an object of this invention to provide an efficient, semiconductor material suitable for application to photovoltaic conversion of solar energy to electricity.

It is a further object to provide a doped semiconductor material comprising polycrystalline silicon containing a desired concentration of dopant.

These and other objects are provided according to this invention in a polycrystalline semiconductor material consisting essentially of silicon having a mean grain size less than 1000 microns containing phosphorus atoms dispersed uniformly (areally and spacially) throughout said polycrystalline silicon rather than at the grain boundaries. The phosphorus dopant is uniformly dispersed within the grains rather than concentrated at the grain boundaries as in polysil doped by prior art techniques such as diffusion. This semiconductor material is particularly useful in a photovoltaic cell as an n-type semiconductor material.

DETAILED DESCRIPTION

Figure 1:
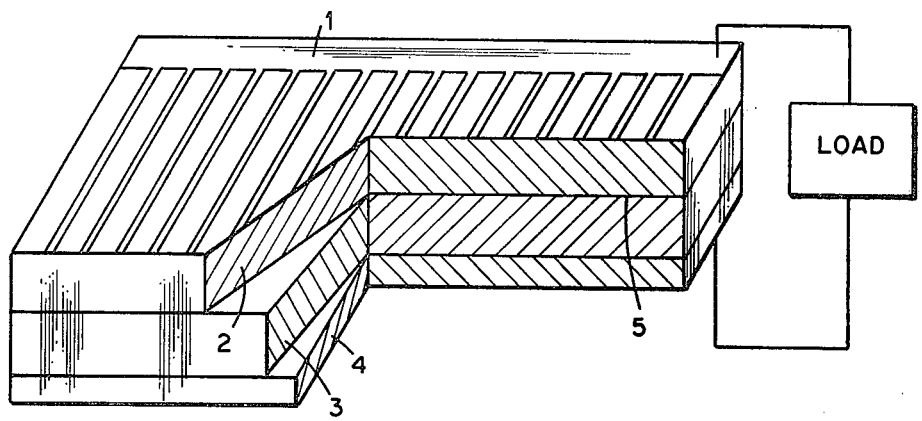
FIG. 1 is a schematic representation of a photovoltaic cell.

According to this invention, polycrystalline silicon doped with high concentrations of phosphorus, up to $10^{17}$ atoms/cm$^3$ are provided by neutron transmutation doping. It has long been recognized that thermal neutron irradiation can be used to introduce certain impurity atoms in semiconducting materials as a consequence of the transmutation process. See, for example, J. W. Cleland et al, Physical Review, Vol. 78, Page 814 (1950). Silicon is a particularly attractive candidate for neutron transmutation doping because it has only one isotope which transmutes to a new element. This new element is phosphorus, a standard n-type dopant in silicon. Normal isotopic silicon contains 3.05 percent of $^{30}$Si which transmutes to $^{31}$P after thermal neutron absorption. $^{31}$P has a half life of 2.6 hours. The $^{28}$Si and $^{29}$Si isotopes normally present transmute to $^{29}$Si and $^{30}$Si, respectively, but these processes do not directly alter the electric properties of the material. So long as the dopant concentrations are kept below about $10^{16}$ atoms per cubic centimeter there are no significant problems associated with induced radioactivity. With phosphorus concentrations above $10^{16}$ atoms per cubic centimeter, thermal neutron absorption by the $^{31}$P atoms induces radioactivity from $^{32}$S, which has a half life of 14.3 days and the material would therefore require extended cooling periods. Dopant concentrations above $10^{17}$ atoms/cm$^3$ are not expected to greatly enhance the properties of silicon solar cells or semiconductors.

It has been shown that uniformity of doping is of importance in a number of device applications such as high-power rectifiers and thyristors as well as avalanche radiation detectors which are prepared from NTD single crystal silicon. See, for example, W. E. Haas et al, Silicon Doping by Nuclear Transmutation, Journal of Electronic Materials, Vol. 5, Page 57 (1976) and V. L. Gelezunas et al, Uniform Large Area High Gain Silicon Avalanche Radiation Detector from Transmutation Doped Silicon, Applied Physics Letters, Vol. 30, No. 2, Page 118 (1977).

Neutron transmutation doping according to this invention can be achieved simply by exposing a sample of polycrystalline silicon to a known thermal neutron flux. Known thermal neutron fluxes are available in a variety of research reactors or from any of a number of neutron sources. From the known thermal neutron flux and the irradiation time, it is possible to accurately predict the total doping concentration achieved.

Irradiation procedures for preparing NTD polysil are identical to those used in the prior art for preparing NTD single crystal material. See, for example, U.S. Pat. No. 4,027,051 (May 31, 1977) to Reuschel et al for "Method of Producing Homogeneously Doped N-Type Si Monocrystals and Adjusting Dopant Concentration Therein by Thermal Neutron Radiation," which is incorporated herein by reference. There are two sources of concentration gradients in NTD silicon, but these are of minor importance in practice. While higher uniform neutron fluxes are preferable, NTD polysil can be prepared from a non-uniform flux. If the thermal neutron flux coming from the reactor or source has gradients associated with it, these will show up as variations in the transmutation-induced phosphorus concentration. These variations are easily eliminated by selected rotations and displacements of the silicon ingots during irradiation. Since neutron flux information for a reactor or neutron source is readily obtainable by well-known methods of flux mapping, it is well within the skill of the art to determine the proper irradiation positions to compensate for flux gradients. Another source of phosphorus concentration gradients is self-shielding of the inner part of a silicon ingot by the outer part. In a 4 inch diameter cylindrical ingot rotated periodically during irradiation, it is estimated that self-shielding would give a phosphorus concentration variation of about 3% from the outside to the inside of the ingot. This effect can be minimized by irradiating thin samples or small cylinders.

A substantial amount of radiation damage accompanied the NTD process for doping silicon. Thermal neutron damage is thought to consist of point defects such as divacancies, di-interstitials, and vacancy-impurity clusters, resembling X-ray and γ-ray irradiation damage. Fast neutrons (ordinarily present to some degree in any neutron flux) produce more extensive damage. Fast neutron damage consists of extended defect clusters which may contain as many as 1000 defects.

In order to be useful as a semiconductor material, the NTD silicon must be annealed to repair radiation damage. Thermal neutron damage in silicon can ordinarily be removed by annealing to about 400° C. for 10-20 minutes and fast neutron damage is removed by annealing to 750° C. for 10-20 minutes.

An important aspect of this invention is based upon the discovery that satisfactory n-type semiconductor material can be prepared from polycrystalline silicon by NTD techniques. While it could be predicted that phosphorus concentrations corresponding in uniformities with the neutron flux would be initially provided, it was unexpected that the phosphorus remained dispersed throughout the polycrystalline material even after annealing to repair radiation damage. Apparently free carrier trapping occurred at the grain boundaries rather than phosphorus aggregation. Polycrystalline silicon containing uniformly dispersed phosphorus demonstrated superior electrical properties to material with phosphorus aggregated at the grain boundaries. Even after annealing at up to 1100° C. for up to 30 minutes to repair radiation damage, the phosphorus dopant remains uniformly dispersed throughout the silicon crystals rather than at the grain boundaries. The diffusion techniques used in device fabrication are in many cases adequate to remove the lattice damage in irradiated samples. If the thermal neutron flux provides a uniform initial dopant concentration, the uniformity is retained upon annealing. For solar cell uses, a uniformity of dopant concentration of ±3% from the mean value is desired. NTD polysil has been prepared having a dopant uniformity of ±1% compared to ±20% or higher for polysil doped by conventional diffusion techniques. This uniformity was particularly unexpected in view of prior art observations that phosphorus migrated to grain boundaries in conventionally doped polysil (see A. L. Fripp et al, Parameters Effecting the Resistivity of Polycrystalline Silicon, Proceedings NSF-ERDA National Workshop on Low Cost Polycrystalline Silicon Solar Cells, Photovoltaics Branch, Division of Solar Energy, ERDA, 1976, Page 59.)

The chief advantages of the NTD process for polysil are the areal and spacial uniformity of dopant distribution, the precise control of the doping level, the elimination of dopant segregation at grain boundaries and the superior control of heavy atom contaminants. The uniform dopant concentration process enables many individual units to be fabricated on a single chip, thereby assuring uniformity of response from individual units.

A solar cell according to this invention is depicted in FIG. 1. Metal grid 1 provides an electrically conductive contact for 31P doped n-type polycrystalline silicon 2. The n-type silicon is separated from p-type polycrystalline silicon 3, e.g. boron diffused, by p-n junction 5. The n-type material may be attached to a substrate 4, graphite for example, if desired. When photons from sunlight strike the p-n junction, a photolytic voltage is generated which is applied to an external load to provide an electric current.

Figure 2:
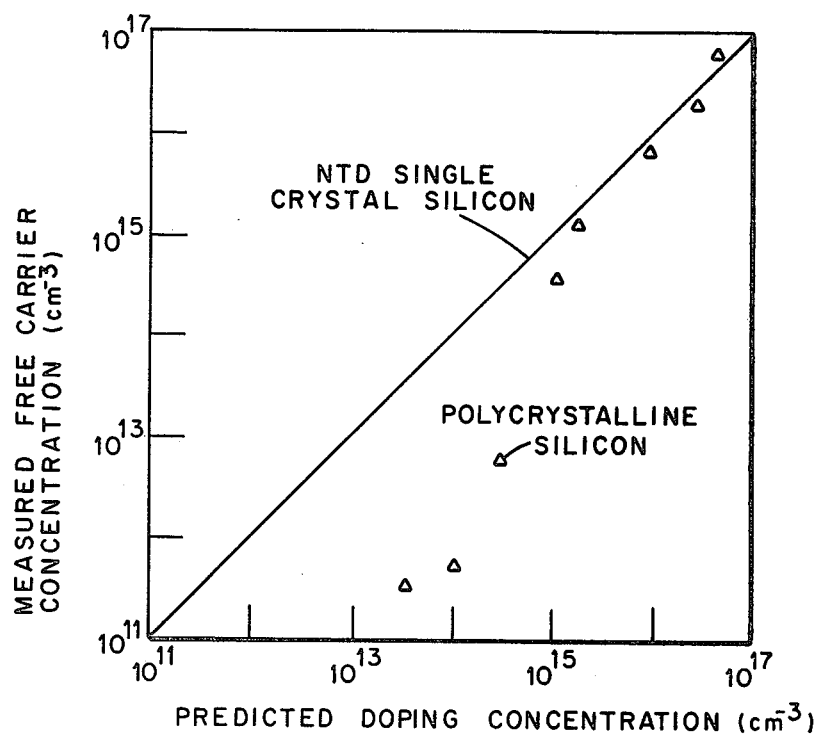
FIG. 2 is a graph of the measured free carrier concentration versus the predicted doping concentration for neutron transmutation doped (NTD) single crystal and polycrystalline silicon.

FIG. 2 depicts measured free carrier concentration of polycrystalline silicon and single crystal silicon, each doped with phosphorus by neutron transmutation doping. The single crystal silicon is represented by the solid line. It is seen that the free carrier concentration in polycrystalline silicon is somewhat less than the predicted values until a doping concentration level of above about $10^{15}$ atoms per cubic centimeters is achieved. Above this doping concentration, free carrier concentrations in polycrystalline silicon are exactly equivalent to the free carrier concentration in NTD single crystal silicon. The data for polycrystalline silicon represented in FIG. 2 was obtained by irradiated a polysil ingot or cylinder in the Oak Ridge Bulk Shielding Reactor at a thermal flux of about $5 \times 10^{14}$ neutrons per sq. cm. per sec. for times ranging from 10 to 120 hours. The ratio of thermal/epithermal neutrons was 3-10. The irradiated samples were annealed at about 800° C. for sufficient time to remove radiation damage. The mean crystal diameter was about 25 microns.

Figure 3:
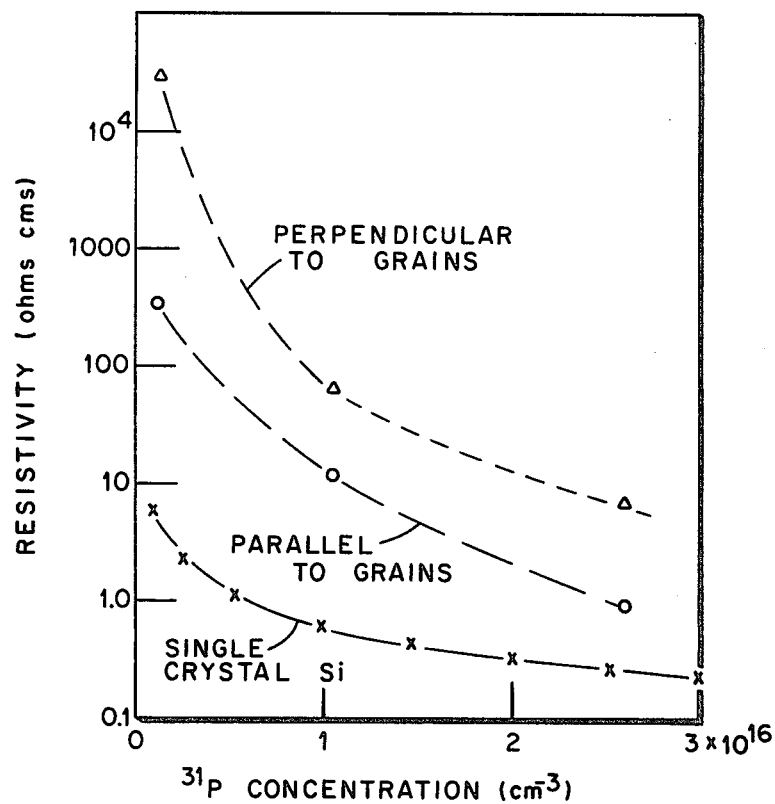
FIG. 3 is a graph of the resistivity versus dopant concentration of NTD polycrystalline and single crystal silicon.

FIG. 3 depicts the resistivity of polycrystalline NTD silicon compared to single crystal NTD silicon as a function of phosphorus dopant concentration. It is seen that at a dopant concentration of $10^{16}$ that the resistivity of the polycrystalline material is on an order of 10-1000 greater than for the single crystal material, however, as the dopant concentration approaches $3 \times 10^{16}$ the polycrystalline material's resistivity is only a factor of about 2-20 higher than for the single crystal material. It can be concluded, therefore, that as the dopant concentration in polycrystalline Si approaches $10^{17}$ atoms per cubic centimeter, the electrical properties of NTD polycrystalline material more closely approaches those of single crystal material.

Figure 4:
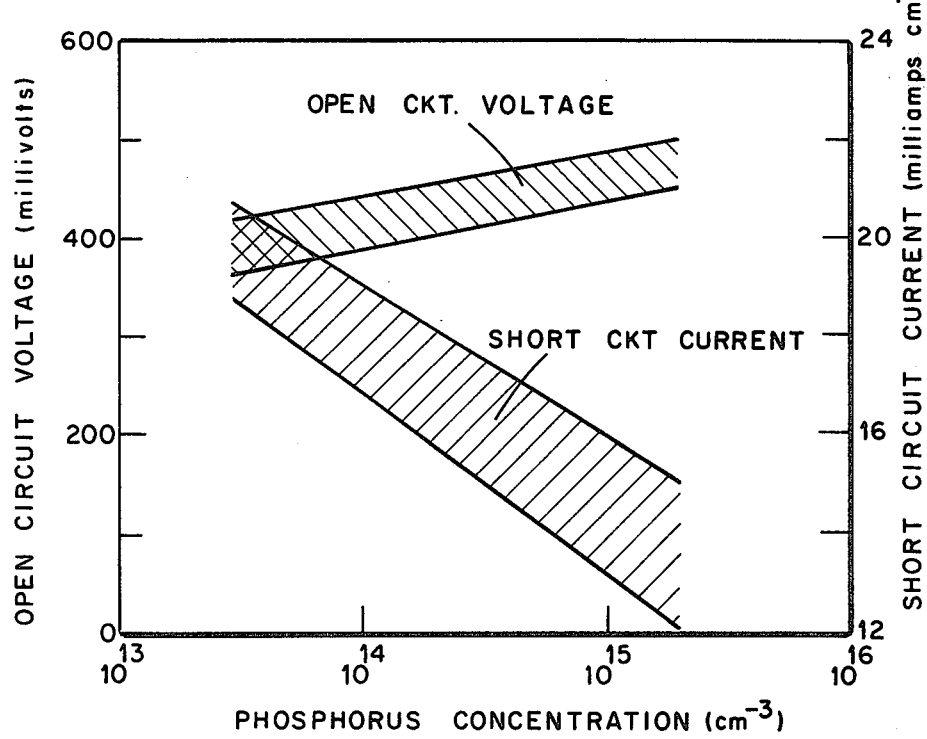
FIG. 4 is a graph of open circuit voltage and short circuit current for an NTD polycrystalline silicon solar cell as a function of phosphorus dopant concentration.
Figure 5:
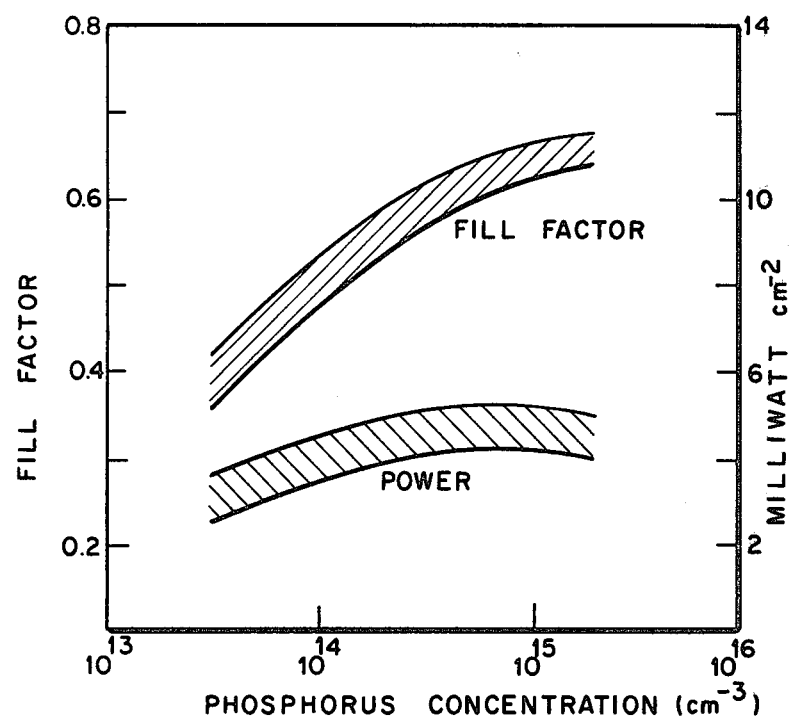
FIG. 5 is a graph of the fill factor and power of NTD polycrystalline solar cells as a function of the phosphorus dopant concentration.

FIGS. 4 and 5 depict the performance of solar cells fabricated from NTD polycrystalline silicon as the n-type material. The p-type material was provided by diffusion of boron through one face of the phosphorus doped crystal. From FIG. 5 it can be seen that the fill factor and power reach maximum values at above $10^{15}$ atoms per cubic centimeters phosphorus dopant concentration. The fill factor is a measure of the total power available for a particular open circuit voltage and is defined as the product of the open circuit voltage and short circuit current at maximum power divided by the product of the open circuit voltage and short circuit current at their maximum values.

Figure 6:
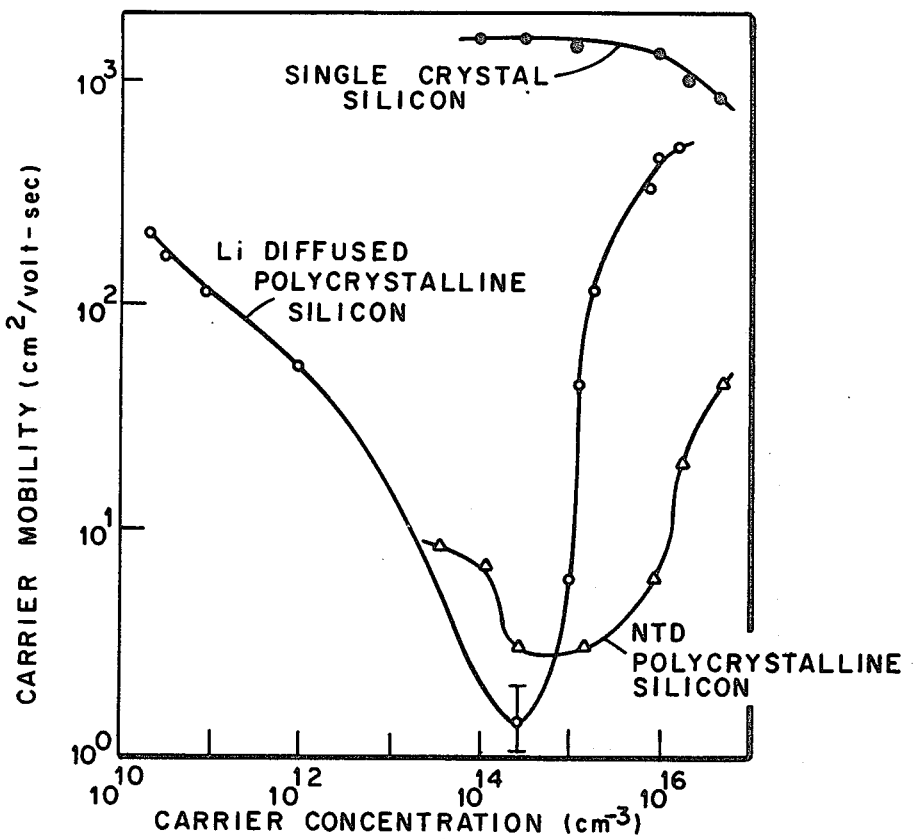
FIG. 6 is a graph of carrier mobility versus carrier concentration of NTD single crystal and polycrystalline silicon as compared to lithium diffused polycrystalline silicon.

FIG. 6 demonstrates the carrier mobility in polycrystalline silicon as a function of carrier concentration. It is seen that the carrier mobility for NTD polycrystalline silicon reaches a minimum at about $10^{15}$ carriers per cubic centimeters. Also shown is data for lithium diffused polycrystalline silicon which shows a minimum at about $4 \times 10^{14}$ atoms/cm$^3$. According to a model proposed by John Y. W. Seto in the Electrical Properties of Polycrystalline Silicon Films, Journal of Applied Physics, Vol. 46, Page 5247 (1975), a minimum in the carrier mobility indicates free carrier trapping at the grain boundaries rather than grain boundary aggregation of the dopant. In fact, the position of this minimum value may be taken as a measure of the carrier concentration that is required to saturate the grain boundary effect in a material having a particular grain size. The polysil data of FIG. 6 was obtained from material having a mean crystal diameter of about 25 microns and corresponds with that depicted in FIG. 2 to demonstrate that at doping levels below about $10^{15}$ phosphorus atoms per cubic centimeter a significant fraction of the carriers, which in this case are electrons, are trapped at grain boundaries. Above this concentration, the fraction of carriers trapped becomes a relatively insignificant part of the total number of carriers. Accordingly, it is clearly seen that there is no aggregation of dopant at the grain boundaries in annealed NTD polycrystalline silicon, and the dopant concentration is highly uniform ± <1% throughout the silicon as is obtainable in NTD single crystal silicon.

The polycrystalline silicon semiconductor material of this invention should contain sufficient phosphorus dopant to saturate the grain boundaries with carriers and thereby provide a free carrier concentration which is very close to that obtained in NTD single crystal silicon of a like dopant concentration, providing electrical properties which most closely approach those of single crystal silicon. This dopant concentration is about twice that required to saturate the grain boundaries with electrons. For example, the saturation free carrier concentration for NTD polycrystalline silicon having a 25 micron crystal size was about $10^{15}$ carriers/cm$^3$ (the minimum of FIG. 6) and this carrier concentration was provided, according to FIG. 2 at about $2 \times 10^{15}$ atoms/cm$^3$. In larger grained silicon, having a grain size of 100-400 microns, the predicted dopant concentration occurred at about $5 \times 10^{13}$ atoms/cm$^3$, which would be about twice that required to saturate the grain boundaries with electrons. For example, semiconductor material according to this invention is provided in NTD polycrystalline silicon having a mean crystal size at least about 25 microns and a phosphorus dopant concentration of about $2 \times 10^{15}$ atoms/cm$^3$ and also in silicon having a mean crystal size of at least 100 microns and a dopant concentration of at least $1 \times 10^{14}$ atoms/cm$^3$. Of course, smaller crystal sizes will require more dopant and larger crystal sizes need less, and it is well within the skill of the art to determine the minimum dopant concentration needed for a particular polycrystalline silicon. Polycrystalline silicon useful in solar cells generally has a mean grain size of at least 25 microns and is doped with phosphorus at a concentration of about $10^{14}$–$10^{17}$ atoms/cm$^3$. Of course, the NTD polysil semiconductor material of this invention can be provided by irradiating polycrystalline silicon deposited as an epitaxial layer on a substrate, such as graphite or heavily doped silicon. The choice of substrate materials must be compatible with any reactor irradiation requirements as regards integrity and induced radioactivity.

Figure 7:
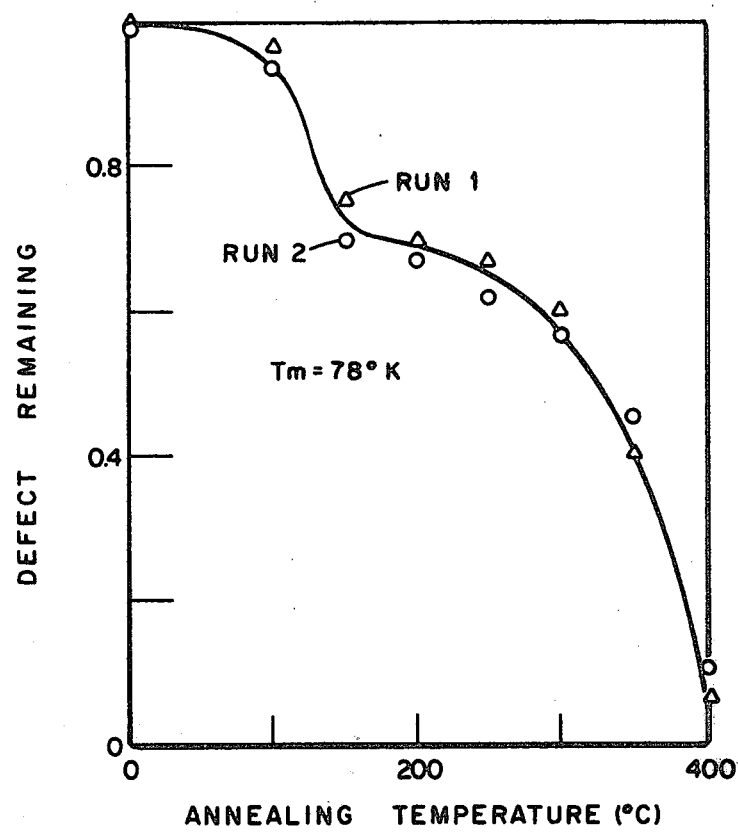
FIG. 7 is a graph of defects remaining versus annealing temperature for annealing thermal neutron damage in NTD polycrystalline silicon.

FIG. 7 depicts the annealing behavior of polycrystalline silicon exposed to a predominantly thermal neutron flux. As shown, the percent defect remaining declines to zero on annealing at 400° C. Each anneal plotted was performed for 20 minutes. The sample was then cooled down to the measurement temperature (tm) and then reheated to the next data point temperature.

Figure 8:
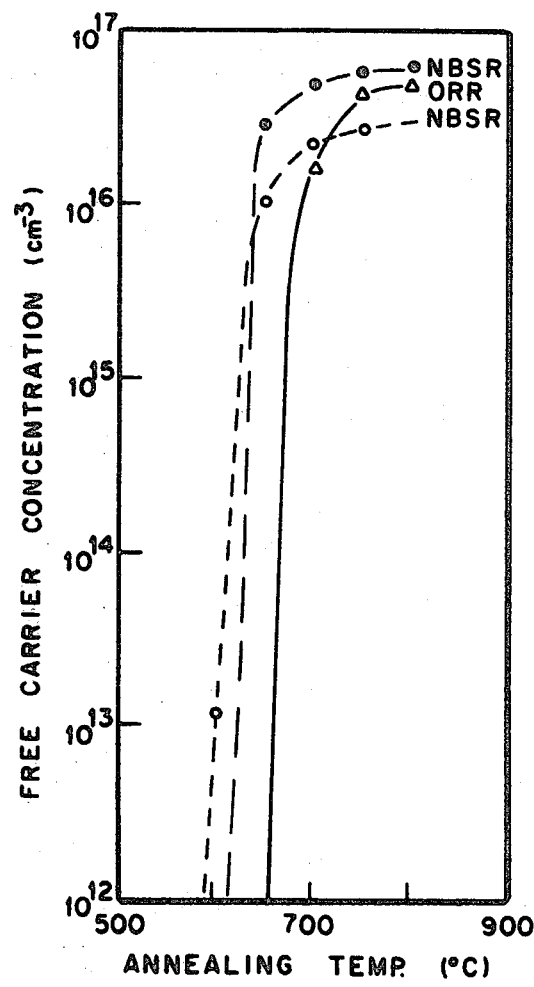
FIG. 8 is a graph of free carrier concentration versus annealing temperature for fast neutron damage in NTD polycrystalline silicon.

FIG. 8 depicts the annealing behavior of polycrystalline silicon exposed to a predominantly fast neutron flux in an Oak Ridge Reactor and the National Bureau of Standards Reactor. Each anneal was performed for 20 minutes, cooled to the measurement temperature (tm) of 78° C. and then heated to the next data point temperature. As shown, full recovery of the carrier concentration occurs at about 750° C. With the possible exception of the minority carrier lifetime (MCL), all other electrical properties of the material are also recovered at this temperature. The annealing step does not depend upon the crystal size of the silicon. The MCL of control samples as well as irradiated samples is reduced by annealing, indicating that the MCL is a property of the silicon, irrespective of any irradiation.

Figure 9:
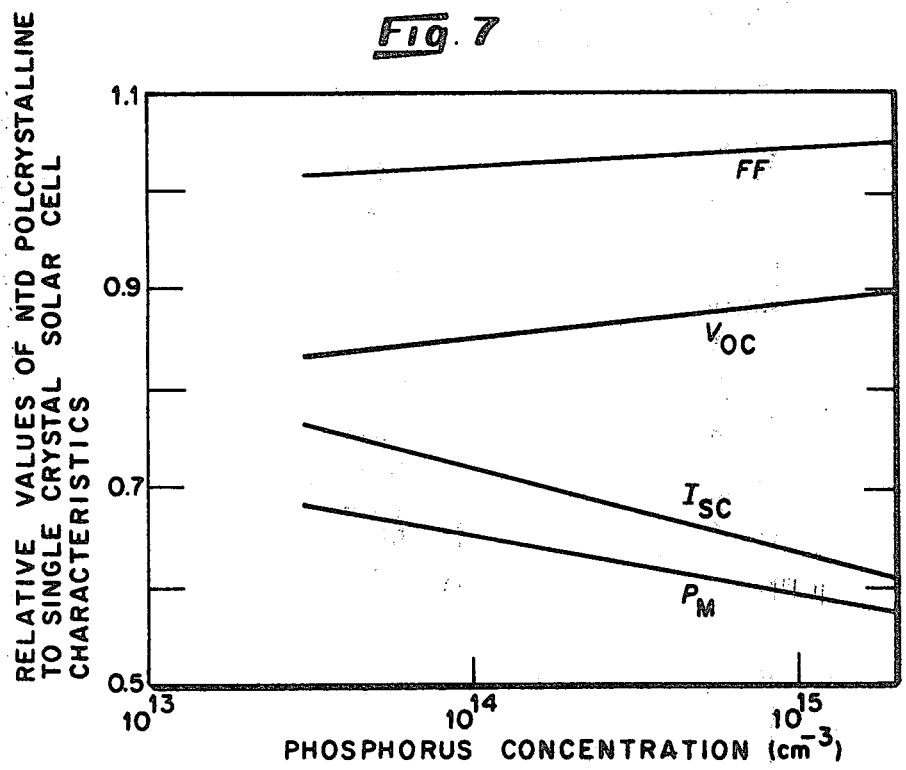
FIG. 9 is a graph of relative electrical characteristics of NTD polycrystalline silicon solar cells as compared to single crystal solar cells as a function of phosphorus dopant concentration.

FIG. 9 shows the relative electrical properties of solar cells prepared from neutron transmutation doped polycrystalline silicon (having a mean crystal size of about 100 microns) compared to single crystal silicon solar cells prepared by the same fabrication technique. As shown, the fill factor is approximately the same or slightly higher for the polycrystalline silicon solar cell and the open circuit voltage approaches 9/10 of the value for single crystal silicon. The short circuit current is from 65 to 80% of the value of single crystal silicon and the maximum power is approximately 60% at about $3 \times 10^{15}$ atoms per cubic centimeter dopant concentration. These comparisons were made with solar cells fabricated by identical fabrication techniques. No non-reflective coatings were used in either case. It appears from this comparison that overall efficiency of approximately 50% of the efficiency of high-quality single crystal silicon cells can be achieved according to this invention. Polycrystalline silicon cells should be doped by nuclear transmutation doping to phosphorus concentrations of from $10^{14}$ to $10^{17}$ atoms per cubic centimeter. The optimum doping concentration of a particular polysil material will be selected to provide the best combination of MCL and other electrical properties. The NTD polysil solar cells of this invention become more efficient when incident solar energy is concentrated, e.g. 100 suns, such as in central solar receivers. The preferred phosphorus dopant concentration for such applications is about $10^{15}$ atoms/cm$^3$.

DESCRIPTION OF THE PREFERRED EMBODIMENT

Once polycrystalline silicon material has been doped to the desired phosphorus dopant concentration by exposure to appropriate neutron flux for the required time, as is customary in the art of neutron transmutation doping, fabrication procedure is identical to well known semiconductor fabrication techniques. From this starting material blanks are cut typically 1 centimeter by 2 centimeters by 0.5 millimeters in thickness. These blanks should be cleaned and degreased by washing with, in sequence, trichloroethylene, acetone, methanol and deionized and distilled water. Blanks should then be blown dry. The clean blanks are chemically polished in acid etch. The typical etch solution is a mixture of nitric, hydrofluoric and glacial acidic acids in amount by volume of 2/1/1, respectively. The polished blanks are then rinsed in water and blown dry. The wafers are inserted in the furnace equipped for boron diffusion. Preferably, diffusion is carried out across the grains, i.e., perpendicular to the major axis of the grains. Boric oxide, boron nitride, or BCl$_3$ are painted on the blank or added to the furnace gas stream and resistance or induction heating is used. Boron is diffused to the desired depth, usually about 2000 to 4000 Å, as is customary in fabrication of silicon solar cells. Diffusion time and temperature depends upon the resistivity of the starting material. Typical diffusion temperatures are between 850° and 1000° C. Typical diffusion times may be between 5 and 45 minutes. After the diffusion process the blank is cooled and dipped in hydrofluoric acid to remove oxides, rinsed in water and blown dry. The front surface, that is the surface to be exposed to sunlight, is masked with an acid resisting solution or with teflon tape. The back surface will have a layer of boron attached to it. This layer can be removed by lapping or sand blasting. Complete boron layer removal can be assured by checking electrical conductivity. A back contact is then applied typically by electroless nickel plating or by an evaporated metal layer. The back surface is then masked with an acid resisting solution or polytetrofluorethylene tape. The exposed edges of the wafer are chemically etched with, for example, a 2/1/1 volume ratio mixture of hydrofluoric, nitric and glacial acidic acid. Next, all masking is removed and the cell is cleaned and degreased by washing in sequence with trichloroethylene, acetone, methanol, deionized and distilled water and blown dry. Electrical contact is applied to the front surface by metal evaporation through an appropriate fingered metal mask. The cell with the contact in place should be sintered for 15 minutes in hydrogen at about 500° C. The resulting solar cells may be provided with non-reflective coating, etc. to improve the efficiency prior to use. Of course, other p-type dopants such as gallium may be used without departing from the scope of this invention.

What is claimed is:

1. A semiconductor material comprising polycrystalline silicon having a mean grain size less than 1000 microns containing phosphorus atoms dispersed throughout said polycrystalline silicon rather than at the grain boundaries said semiconductor material prepared by exposing polycrystalline silicon containing $^{30}Si$ to a neutron flux to cause the transmutation of $^{30}Si$ to $^{31}P$, thereby providing polycrystalline silicon containing dispersed phosphorus atoms, and then annealing said polycrystalline silicon containing phosphorus to remove radiation damage.

2. The semiconductor material of claim 1 wherein said phosphorus atoms are present in a uniform concentration $\pm 1\%$, throughout said silicon.

3. The semiconductor material of claim 1 in which said phosphorus atoms are present at a concentration of $10^{15}$ atoms/cm$^3$.

4. The semiconductor material of claim 2 in which said mean grain size is at least 25 microns and said phosphorus is present at a concentration of $10^{14}$–$10^{17}$ atoms/cm$^3$.

5. In a photovoltaic cell comprising a p-type semiconductor material in contact with an n-type semiconductor material forming a p-n junction therebetween, the improvement in which said n-type semiconductor material is the material of claim 1.

6. In the photovoltaic cell of claim 5 the improvement in which said p-type material is provided by diffusing boron into said polycrystalline silicon having a mean grain size less than 1000 microns containing phosphorus atoms dispersed throughout said polycrystalline silicon rather than at the grain boundaries.

7. In a photovoltaic cell comprising a p-type semiconductor material in contact with an n-type semiconductor material forming a p-n junction therebetween, the improvement in which said n-type semiconductor material is the material of claim 4.

8. In a photovoltaic cell comprising a p-type semiconductor material in contact with an n-type semiconductor material forming a p-n junction therebetween, the improvement in which said n-type semiconductor material is the material of claim 3.